(12) United States Patent
Hildebrand

(10) Patent No.: US 7,802,060 B2
(45) Date of Patent: Sep. 21, 2010

(54) HARDWARE CONTROL FOR CHANGING THE OPERATING MODE OF A MEMORY

(75) Inventor: Uwe Hildebrand, Erlangen (DE)

(73) Assignee: Infineon Technologies AG, Munich (DE)

( * ) Notice: Subject to any disclaimer, the term of this patent is extended or adjusted under 35 U.S.C. 154(b) by 936 days.

(21) Appl. No.: 11/463,488

(22) Filed: Aug. 9, 2006

(65) Prior Publication Data

US 2007/0061525 A1    Mar. 15, 2007

(30) Foreign Application Priority Data

Aug. 9, 2005    (DE) ............... 10 2005 037 635

(51) Int. Cl.
*G06F 12/00*    (2006.01)
(52) U.S. Cl. .............. 711/154; 711/170; 713/340; 710/36
(58) Field of Classification Search ............ 711/154, 711/170; 713/340; 710/36
See application file for complete search history.

(56) References Cited

U.S. PATENT DOCUMENTS

| | | | | |
|---|---|---|---|---|
| 5,396,635 A * | 3/1995 | Fung | ............ | 713/323 |
| 5,404,543 A | 4/1995 | Faucher et al. | | |
| 7,428,644 B2 * | 9/2008 | Jeddeloh et al. | ............ | 713/300 |
| 2006/0271807 A1 * | 11/2006 | Suzuki et al. | ............ | 713/600 |
| 2008/0238533 A1 * | 10/2008 | Kato | ............ | 327/535 |

\* cited by examiner

*Primary Examiner*—Hong Kim
(74) *Attorney, Agent, or Firm*—Patterson & Sheridan, L.L.P.

(57) ABSTRACT

Circuit arrangement having a memory unit which can be operated either in a low-power operating mode or in a normal-power operating mode. A setting unit sets the operating mode of the memory unit, a detector unit detects an access operation to the memory unit, and a control unit controls the setting unit on the basis of the detection result from the detector unit, where the detector and control units are hardware components.

15 Claims, 3 Drawing Sheets

HARDWARE CONTROL FOR CHANGING THE OPERATING MODE OF A MEMORY

CROSS-REFERENCE TO RELATED APPLICATIONS

This application claims foreign priority benefits under 35 U.S.C. §119 to co-pending German patent application number DE 10 2005 037 635.5, filed 9 Aug. 2005. This related patent application is herein incorporated by reference in its entirety.

BACKGROUND OF THE INVENTION

1. Field of the Invention

The invention relates to memory devices and more particularly to changing the operating mode of memory units. In this context, it is possible to change between a low-power operating mode and a normal-power operating mode.

2. Description of the Related Art

To reduce the power consumption of electronic appliances, memory units are normally changed to a low-power operating mode during time periods in which they are not required. Depending on the type of memory unit, the low-power operating mode may be what is known as the data retention mode in the case of SRAMs (static random access memory) or the self-refresh mode in the case of DRAMs (dynamic random access memory) or isolation of the supply voltage in the case of ROMs (read-only memory).

In general terms, a low-power operating mode in the present patent application is understood to mean an operating mode in which the power requirement of the relevant component or of the relevant circuit arrangement is reduced and accordingly the component or the circuit arrangement cannot execute the functions for which it is actually designed during normal operation. By way of example, a standby mode is a low-power operating mode.

In a normal-power operating mode, the functions of the relevant component or of the relevant circuit arrangement for which the component and the circuit arrangement are designed can be executed. By way of example, in the normal-power operating mode it is possible to access a memory unit, i.e. data values can be stored in the memory unit and data values can be read.

To reduce the power consumption of circuit arrangements with memory units as far as possible, the memory units need to be changed to suitable low-power operating modes as often as possible. Different operating modes of the circuit arrangement give rise to different demands on the memory units and their operating modes. Added to this is the fact that the operating modes of the circuit arrangement can change dynamically during operation.

In conventional circuit arrangements, the operating mode of the associated memory units is controlled and configured by a piece of software. In this context, the operating mode can be configured statically or dynamically.

The text below cites a few examples for setting the operating mode statically. Thus, hardware units in a memory system can be set by means of a piece of software such that they isolate a ROM, which is required for booting the system, from the supply voltage after a boot operation has taken place. In addition, a memory unit can be set by a piece of software after a reset in accordance with the current configuration of the superordinate system. An example of this is a mobile radio which has been switched off and which can be started up only in a battery charging mode.

An example of the dynamic configuration of the low-power operating mode is a piece of hardware which is configured by a piece of software, during a time period in which it is not necessary to access a particular ROM memory unit, such that the hardware isolates the ROM memory unit from the supply voltage. In addition, by way of example, an SDRAM controller can be prompted by a piece of software to change a DRAM to a self-refresh mode while the superordinate system is in an idle state.

A drawback of systems in which a piece of software sets the operating mode of memory units is that the software needs to know precisely in what operating state of the circuit system the relevant memory units are needed and not needed. The result of this is increased complexity of the software, with the software-based dynamic configuration of the operating mode having an even more disadvantageous effect on the complexity of the software than the static configuration.

Another problem of software-based configuration of the operating mode of memory units is that the software must explicitly control the changes between the various operating modes. Consequently, the software needs to be informed about what content of the various memory units and their subunits is needed in the various operating modes of the circuit system. In addition, the software also needs to know what volatile memory contents must not be lost during a low-power operating mode because they are needed again as soon as the circuit system is in another operating state. It is therefore necessary to ensure that these data are retained.

As a result, this means that conventional circuit arrangements need to have a very complex and hence expensive piece of software in order to be able to make changes of operating mode for their memory units.

SUMMARY OF THE INVENTION

The invention is therefore based on the object of specifying a circuit arrangement having a memory unit, where the operating mode of the memory unit can be changed with as little software expense as possible.

The inventive, in particular embedded, circuit arrangement has a memory unit, a setting unit, a detector unit and a control unit. The memory unit may be either in a low-power operating mode or in a normal-power operating mode. The operating mode of the memory unit is set using the setting unit. The detector unit detects access operations to the memory unit, an access operation to the memory unit being a read access operation or a write access operation, for example. The control unit uses the detection results from the detector unit to control the setting unit on the basis of these results and possibly to signal to the setting unit whether the operating mode of the memory unit needs to be changed. If the memory unit has not been accessed for some time, for example, then it may be appropriate in this case to change the memory unit to a low-power operating mode in order to reduce power consumption. If the memory unit is in the low-power operating mode and the detector unit detects attempted access to the memory unit, the control unit can instruct the setting unit to change to the normal-power operating mode.

A fundamental idea of the invention is that the detector unit, the control unit and particularly the setting unit are produced in hardware, i.e. these hardware units do not execute any software and, accordingly, these hardware units do not execute any machine code.

Implementing the detector and control units as hardware units makes it possible to dispense with the software which usually performs the tasks of the inventive detector and control units. This also means that the software which continues to be executed on the inventive circuit arrangement is not involved in a change of operating mode. This allows the complexity of the software to be reduced and also the software to be implemented less expensively. In addition, the invention reduces the power consumption of the circuit arrangement without this requiring the use of expensive software.

Preferably, the inventive circuit arrangement contains a processor which executes a piece of software which is used to configure the detector unit and/or the control unit. By way of example, a system start involves storage elements (e.g., registers) in the detector and control units having particular information written to them which later allows these units to make the required change of operating mode fully autonomously and without any other action taken by the software.

Advantageously, a memory access operation can be detected in at least two different ways. One embodiment involves the detector unit observing a selection line which is used to select the memory unit or the hardware block incorporating the memory unit. As soon as the relevant selection signal is activated, an access operation to the memory unit is thus automatically detected. The selection signal may also be a Chip Select signal, for example, which is used to select the chip incorporating the memory unit.

In another embodiment, an address comparator may be used. The address comparator is incorporated in the detector unit and compares the addresses which are transmitted via the bus connected to the memory unit with prescribed addresses which relate to the memory unit. If the compared addresses match, an access operation to the memory unit is thus likewise detected. The addresses which are compared with one another by the address comparator do not necessarily need to be complete addresses. By way of example, it may already suffice to compare the more significant address bits with one another. In this case, it is merely necessary to ensure that a comparison of this kind permits a distinct conclusion regarding whether or not the memory unit needs to be accessed.

In addition, the detector unit may also observe other signals—such as the read/write signal—which are then evaluated by the control unit. By way of example, a RAM may be designed such that data can be read from the RAM during a low-power operating mode but no data can be stored in the RAM during the low-power operating mode. Consequently, it makes sense in this case to distinguish between a read access operation and a write access operation. If a read access operation takes place during the low-power operating mode, the RAM can remain in the low-power operating mode whereas it needs to be put back into the normal-power operating mode for a write access operation.

Preferably, the address comparator contains one or more storage elements (e.g., registers) storing the prescribed addresses or the prescribed parts of the addresses which need to be compared with the addresses transmitted via the bus.

It is particularly advantageous if the software which is being executed on the processor stores the prescribed addresses or the prescribed parts of the addresses in the registers of the address comparator. This can be done upon a system start, for example.

So that the control unit can determine the time at which the memory unit is advantageously changed to the low-power operating mode, the control unit preferably contains a measuring unit which starts to measure the time which elapses after every access operation to the memory unit.

If it is established in the course of this that a time period has elapsed which is longer than a prescribed time period without the memory unit having been accessed, the control unit prompts the setting unit to change the memory unit to the low-power operating mode. This timeout therefore specifies a simple and reliable criterion which can be used to bring about a change to the low-power operating mode.

Since the time period after which an unused memory unit is changed to the low-power operating mode is dependent on various parameters registers which are able to store information about this time period may be provided. In particular, these registers can have information written to them by the software when the system starts.

If an attempt is made to access the memory unit while it is in the low-power operating mode, this access operation cannot be executed immediately but rather the memory unit must first be changed back to the normal-power operating mode. In this connection, it is advantageous to provide a delay unit which delays access to the memory unit, for example by inserting what are known as "wait states", until the memory unit has returned to the normal-power operating mode.

As an alternative to delaying the access, access may also be interrupted or even terminated by an appropriate interruption unit, so that the access is effected again after the memory unit has returned to the normal-power operating mode.

Other options for delaying or interrupting the access to the memory unit can also be found in the AMBA AHB specification, ARM Ltd. Rev. 2.0, http://www.arm.com/products/solutions/AMBA_Spec.html.

In line with another preferred refinement of the invention, the circuit arrangement has a unit which can be used for selectively activating or deactivating the control unit.

So that the detector unit and the control unit can continue to be active during the memory unit's low-power operating mode, it is advantageous to feed the detector unit and the control unit from a different supply voltage source from the memory unit.

The memory unit must not necessarily have just a single low-power operating mode, but rather it is also possible to select from two or more low-power operating modes. When the normal-power operating mode is to be exited in this case, the control unit decides the low-power operating mode to which the memory unit is changed.

If the inventive circuit arrangement has a second memory unit or further memory units it is necessary to ensure that each of these memory units has an associated separate inventive detector unit and an associated separate inventive control unit. In addition, each memory unit may also have a separate setting unit. Alternatively, however, it is also possible for one setting unit to be responsible for a plurality of memory units.

In one particularly preferred refinement of the inventive circuit arrangement, there are two processors, with the first processor being connected to the memory unit and accordingly also to the detector unit and to the control unit via a first bus and the second processor being connected to the setting unit via a second bus. In this case, the two buses are separate from one another which means that it is not possible for them to interchange data. In a conventional circuit arrangement in which the operating mode of the memory unit is stipulated by a piece of software, the arrangement described would make it impossible for a piece of software which is being executed on the first processor to initiate rundown of the memory unit after a timeout. The reason for this is the lack of a data link between the two buses, which means that the software which is being executed on the first processor would not be able to instruct the setting unit as appropriate. The inventive circuit arrangement solves this problem because in this case there are hardwired control lines between the control unit and the setting unit and hence no communication via the bus is required when the operating mode of the memory unit is changed.

Preferably, the inventive memory unit is a ROM or an SRAM or a DRAM. In an SRAM, the data retention mode is a low-power operating mode, whereas the self-refresh mode is a low-power operating mode in a DRAM. Another low-power operating mode of SRAMs and DRAMs is achieved by isolating the supply voltage. A ROM is likewise changed to the low-power operating mode by disconnecting, i.e. isolating, it from the supply voltage.

The invention is naturally not limited to particular memory units such as ROMs, SRAMs or DRAMs. Rather, the inventive memory unit may be a memory unit of any design. By way of example, the memory unit may also comprise a register bank which is constructed from flip-flops.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
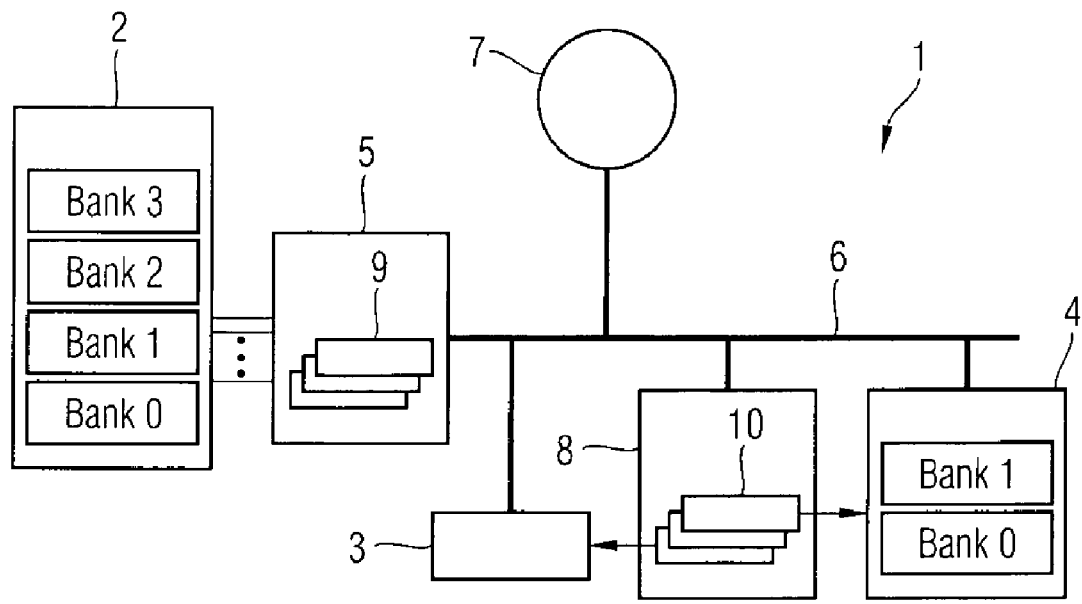
FIG. 1 shows a block diagram of a circuit system based on the prior art.

FIG. 1 shows a block diagram of a conventional embedded circuit system 1. The circuit system 1 has three memories 2, 3 and 4, each of the memories 2, 3 and 4 being of a different memory type. The memory 2 is an SDRAM, the memory 3 is a ROM and the memory 4 is an SRAM. The SDRAM 2 also contains four SDRAM banks, while the SRAM 4 comprises two SRAM banks. The SDRAM 2 is connected to a processor 7 via an SDRAM controller 5 and a bus 6. The ROM 3 and the SRAM 4 are connected to the processor 7 via the bus 6. In addition, the ROM 4 and the SRAM 5 are connected to a control unit (power control unit) 8. The control unit 8 is likewise in contact with the processor 7 via the bus 6.

The SDRAM controller 5 is used to control access to the SDRAM 2. In addition, the SDRAM controller 5 sets the operating mode of the SDRAM 2. For this purpose, the SDRAM controller 5 has registers 9. If the operating mode of the SDRAM 2 needs to be changed, the registers 9 need to have fresh information written to them by the software which is being executed on the processor 7. The SDRAM controller 5 then sets the new operating mode of the SDRAM 2.

The operating modes of the ROM 3 and of the SRAM 4 are set by the control unit 8. Just like the SDRAM controller 5, the control unit 8 has registers 10 for this purpose. When changing the operating mode of the ROM 3 or of the SRAM 4, the appropriate registers 10 are reconfigured by the software which is being executed on the processor 7, and then the control unit 8 makes the appropriate change of operating mode.

Figure 2:
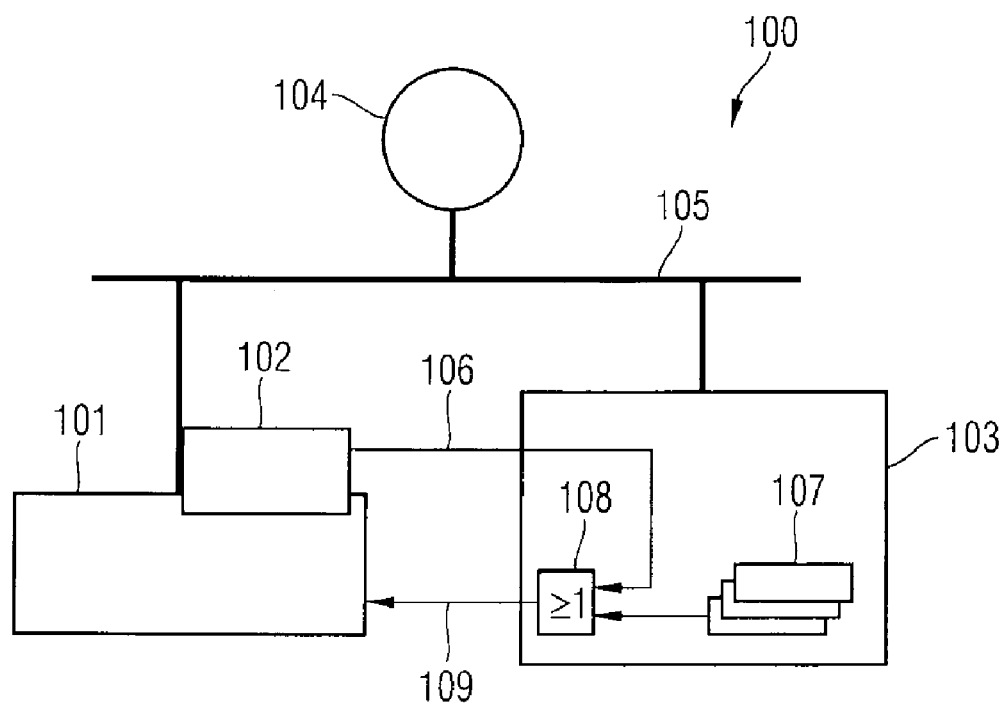
FIG. 2 shows a block diagram of a circuit system 100 as a first exemplary embodiment of the inventive circuit arrangement.

FIG. 2 shows the block diagram of an embedded circuit system 100 as a first exemplary embodiment of the invention. The circuit system 100 comprises a ROM 101, a detector and control unit 102, a supply voltage control unit 103 (also referred to herein as a setting unit), a processor 104 and a bus 105. Although the detector and control unit 102 is shown as a single functional component, it is contemplated that the functions of the unit 102 may be performed by individual components (e.g., a detector unit for detecting an access operation to the memory unit, and a separate control unit for controlling the supply voltage control unit 103 on the basis of the detection result from the detector unit).

The ROM 101 is connected to the processor 104 via the bus 105. In addition, the bus link between the ROM 101 and the processor 104 is monitored by the detector and control unit 102. The supply voltage control unit 103 is likewise connected to the processor 104 via the bus 105. The detector and control unit 102 is connected to the supply voltage control unit 103 via a control line 106. Both the detector and control unit 102 and the supply voltage control unit 103 are hardware components.

The ROM 101 may be in a low-power operating mode or a normal-power operating mode. In the low-power operating mode, the ROM 101 is isolated from its supply voltage. In the normal-power operating mode, the ROM 101 has the supply voltage applied to it and data can be read from the ROM 101 via the bus 105.

The detector and control unit 102 contains a timer circuit 102A which is likewise hardware. After every access operation to the ROM 101, the timer circuit starts to measure the time elapsing. If a particular time period without fresh access to the ROM 101 has elapsed after an access operation, the detector and control unit 102 prompts the ROM 101 to be changed to the low-power operating mode. To this end, the detector and control unit 102 sends the supply voltage control unit 103 an appropriate control signal via the control line 106, whereupon the supply voltage control unit 103 isolates the ROM 101 from its supply voltage.

Information about the time period after which the ROM 101 needs to be run down to the low-power operating mode when it is not being accessed is preferably stored in registers in the detector and control unit 102. The length of this time period is dependent particularly on the time which is required in order to change the ROM 101 to the low-power or normal-power operating mode and on the power saving which can be achieved. Ideally, the information about this timeout time is stored in the registers of the detector and control unit 102 by the software which is executed on the processor 104 when the system starts.

In addition, the software which is being executed on the processor 104 also determines whether or not the detector and control unit 102 controls the setting of the operating mode of the ROM 101. For this purpose, the supply voltage control unit 103 has registers 107 which the software uses to store information about this. The registers 107 and the control line 106 are connected to the inputs of a logic gate 108, so that upon every control command from the detector and control unit 102 a check is performed to determine whether the operating mode is to be controlled via the detector and control unit 102 or whether the detector and control unit 102 is deactivated.

In FIG. 2, the output of the logic gate 108 feeds a line 109 which connects the supply voltage control unit 103 to the ROM 101. Provision can be made for the line 109 to be used to transmit control commands to the ROM 101 which contain information about what operating mode the ROM 101 needs to adopt. Alternatively, the line 109 may be intended to supply the ROM 101 with the supply voltage. If the ROM 101 is to be changed to the low-power operating mode, the supply voltage would be removed from the line 109.

If the ROM 101 is in the low-power operating mode, i.e. has been isolated from the supply voltage, the detector and control unit 102 continually checks whether an attempt is being made to access the ROM 101 via the bus 105. For this purpose, there are two different options available. On the one hand, a selection signal can be observed which indicates an access operation to the ROM 101 by virtue of the hardware block which incorporates the ROM 101 being selected. On the other hand, the addresses which are transmitted via the bus 105 can be evaluated. To this end, the detector and control unit 102 has comparators which compare the addresses transmitted via the bus with addresses stored in registers. As soon as a match is found, an access operation has been detected. Provision may also be made for just certain parts of the addresses to be compared with one another if an access operation to the ROM 101 is already clearly readable from these address elements. Typically, these address elements are the more significant address bits. The registers storing the comparison addresses can be configured by the software.

As soon as the detector and control unit 102 has detected an access operation to the ROM 101, it prompts the supply voltage control unit 103 to return the ROM 101 to the normal-power operating mode, so that the access operation can be executed.

Since data can be read from the ROM 101 only when it is in the normal-power operating mode, means are provided which delay or interrupt an access operation during the low-power operating mode. These means are likewise hardware components. By way of example, an access operation can be delayed by inserting "wait states".

So that the detector and control unit 102 and also the supply voltage control unit 103 are also ready for use in the run-down state of the ROM 101, the detector and control unit 102 and the supply voltage control unit 103 also need to have the supply voltage applied to them during the low-power operating mode of the ROM 101.

FIG. 2 shows the ROM 101 with just one memory which can be accessed via the bus 105. However, there may also be more than one memory connected to the bus 105. In this case, each of the memories requires its own detector and control unit.

Instead of a ROM, the memory 101 may also be of another memory type, for example a DRAM or an SRAM. A low-power operating mode in the case of a DRAM is the self-refresh mode. In the case of an SRAM (static random access memory), the data retention mode is a low-power operating mode. In addition, both a DRAM and an SRAM can be changed to a low-power operating mode by disconnecting them.

Figure 3:
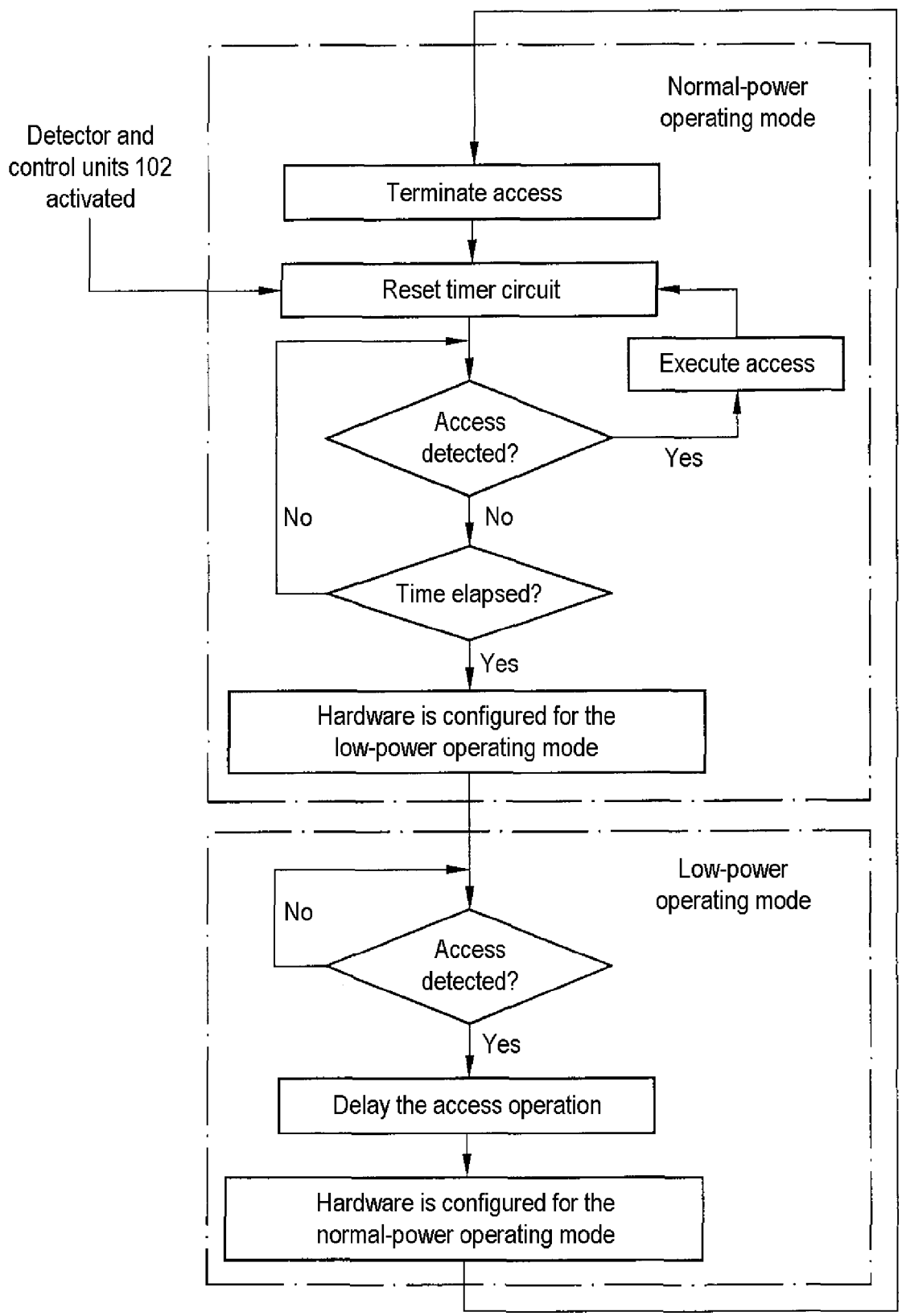
FIG. 3 shows a flowchart to illustrate the way in which the circuit system 100 shown in FIG. 2 works.

The way in which the detector and control unit 102 works is illustrated in FIG. 3 by a flowchart. The text below briefly summarizes this manner of operation once again.

As soon as the detector and control unit 102 is activated by the software which is being executed on the processor 104, the timer circuit is reset. The timer circuit then starts to measure the time before either the ROM 101 has been accessed or the prescribed time period has been reached. If the ROM 101 is accessed during this time period, the access operation is executed and the time measurement then starts again. If the prescribed time has elapsed for the first time without the ROM 101 being accessed, however, an appropriate signal is transmitted to the supply voltage control unit 103 via the control line 106, and the hardware is configured for the low-power operating mode. This comprises stopping the supply voltage for the ROM 101, for example. The ROM 101 is then in the low-power operating mode. During this time, the detector and control unit 102 continues to monitor whether an attempt is being made to access the ROM 101. If an access operation is performed, it is either delayed or interrupted and the necessary steps are taken to return the ROM 101 to the normal-power operating mode. As soon as the normal-power operating mode of the ROM 101 has been restored, the relevant data can be read from the ROM 101.

Figure 4:
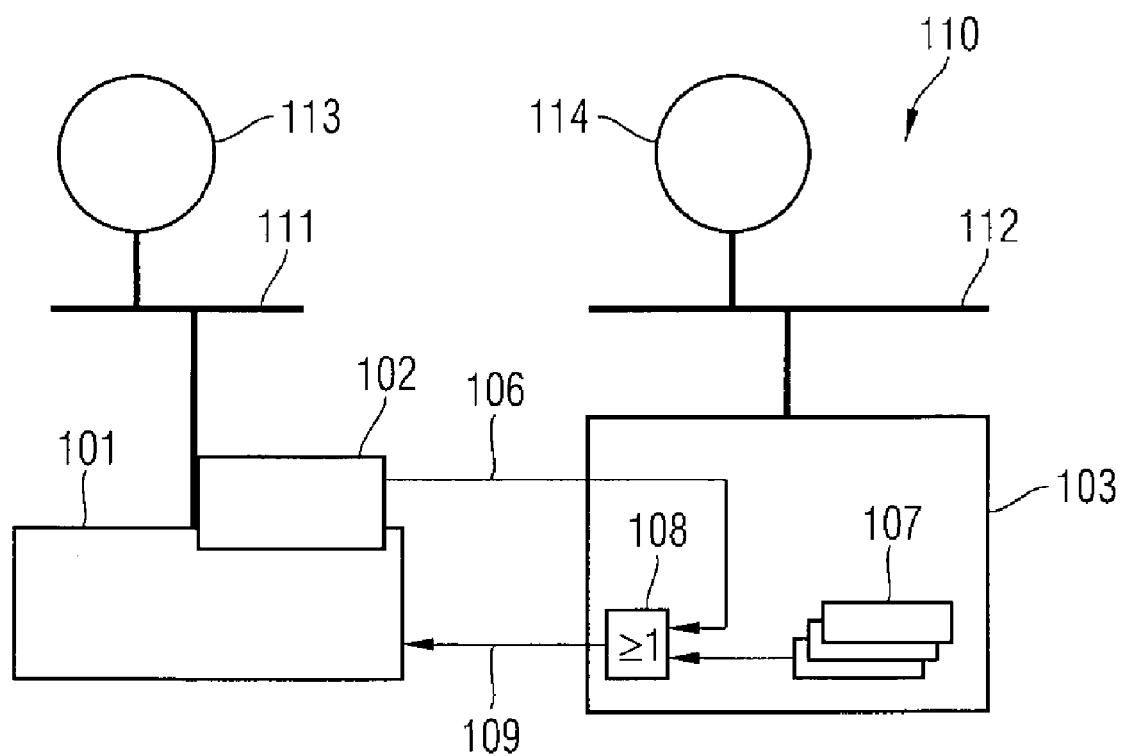
FIG. 4 shows a block diagram of a circuit system 110 as a second exemplary embodiment of the inventive circuit arrangement.

FIG. 4 shows the block diagram of an embedded circuit system 110 as a second exemplary embodiment of the invention. Many parts of the circuit system 110 correspond to those in the circuit system 100 shown in FIG. 2. The components which are identical in the two circuit systems 100 and 110 have therefore been identified using the same reference symbols. Unlike the circuit system 100, the circuit system 110 has two buses 111 and 112 between which there is no connection. The bus 111 is used to connect a digital signal processor 113 to the ROM 101, and the bus 112 is used to connect a processor 114 to the supply voltage control unit 103. Since there is no bus link between the digital signal processor 113 and the supply voltage control unit 103, the software which is being executed on the digital signal processor 113 could not independently change the ROM 101 to the low-power operating mode. Only the detector and control unit 102 allows this, since the detector and control unit 102 can transmit appropriate commands to the supply voltage control unit 103 via the control line 104.

It should also be noted for the circuit system 110 that the detector and control unit 102 is configured by the digital signal processor 113, while the processor 114 configures the supply voltage control unit 103.

While the foregoing is directed to embodiments of the present invention, other and further embodiments of the invention may be devised without departing from the basic scope thereof, and the scope thereof is determined by the claims that follow.

What is claimed is:

1. A circuit arrangement, comprising:
   a memory unit operable in a low-power operating mode and in a normal-power operating mode;
   a setting unit for setting the operating mode of the memory unit;
   a detector unit for detecting an access operation to the memory unit;
   a control unit for controlling the setting unit on the basis of the detection result from the detector unit; wherein the detector unit and the control unit are hardware components;
   a processor which executes software for configuring at least one of the detector unit and the control unit;
   a first bus connecting the processor and the memory unit; and
   an additional processor which is connected to the setting unit via a second bus, with data interchange not being possible between the first and second buses.

2. The circuit arrangement of claim 1, wherein the detector unit is configured to detect a selection signal used to select the memory unit in the event of an access operation.

3. The circuit arrangement of claim 2, wherein the detector unit is configured to detect read/write signals related to the access operation to the memory unit, and wherein the control unit controls the setting unit on the basis of the read/write signals.

4. The circuit arrangement of claim 1, wherein the detector unit has an address comparator configured to compare at least portions of addresses of an access operation with at least portions of predefined addresses and, on the basis of the comparison, detect an access operation to the memory unit.

5. The circuit arrangement of claim 4, wherein the address comparator has registers storing the predefined addresses.

6. The circuit arrangement of claim 1, wherein the control unit comprises a measuring unit configured to measure an elapsed time period between the access operation to the memory unit and a next access operation.

7. The circuit arrangement of claim 6, wherein the control unit is configured to signal the setting unit to change the operating mode of the memory unit to the low-power operating mode from the normal-power operating mode in the event the elapsed time period is longer than a prescribed time period.

8. The circuit arrangement of claim 7, wherein the control unit has registers storing the prescribed time period.

9. The circuit arrangement of claim 8, wherein the prescribed time period is stored in the registers by the software which is being executed on the processor.

10. The circuit arrangement of claim 1, further comprising an interruption unit configured to interrupt the access operation to the memory unit in the event the memory unit is in the low-power operating mode at the time of the access operation.

11. The circuit arrangement of claim 1, further comprising a unit for selectively activating and deactivating the control unit.

12. The circuit arrangement of claim 1, wherein the detector unit and the control unit have a supply voltage applied to them during the low-power operating mode of the memory unit.

13. The circuit arrangement of claim 1, wherein the memory unit is operable in at least two different low-power operating modes, and the control unit selects the operating mode of the memory unit from the at least two low-power operating modes and the normal-power operating mode.

14. The circuit arrangement of claim 1, further comprising:
an additional memory unit operable in a low-power operating mode and in a normal-power operating mode;
an additional setting unit for setting the operating mode of the further memory unit;
an additional detector unit for detecting an access operation to the additional memory unit; and
an additional control unit for controlling the additional setting unit on the basis of the detection result from the additional detector unit, wherein the additional detector unit and the additional control unit are hardware components.

15. The circuit arrangement of claim 1, wherein the memory unit is one of a read-only memory (ROM), static random access memory (SRAM) and a dynamic random access memory (DRAM).

* * * * *